United States Patent [19]

Guajardo

[11] Patent Number: 5,006,949
[45] Date of Patent: Apr. 9, 1991

[54] TEMPERATURE COMPENSATED OVERLOAD TRIP LEVEL SOLID STATE RELAY

[75] Inventor: Ciro Guajardo, Harbor City, Calif.
[73] Assignee: Teledyne Industries, Inc., Los Angeles, Calif.
[21] Appl. No.: 516,430
[22] Filed: Apr. 30, 1990
[51] Int. Cl.$^5$ .............................................. H02H 5/04
[52] U.S. Cl. ........................................ 361/18; 361/56; 361/103; 323/907
[58] Field of Search ...................... 361/56, 57, 91, 103, 361/58, 18; 323/907; 307/117

[56] References Cited

U.S. PATENT DOCUMENTS

| | | | |
|---|---|---|---|
| 4,581,540 | 4/1986 | Guajardo | 361/93 |
| 4,593,338 | 6/1986 | Takeda et al. | 361/18 |
| 4,669,026 | 5/1987 | Widlar | 361/103 |
| 4,730,228 | 3/1988 | Einzingek et al. | 361/103 |

*Primary Examiner*—Todd E. DeBoer
*Attorney, Agent, or Firm*—Stephen L. King

[57] ABSTRACT

In solid state relay circuit including a metal oxide field effect transistor connected for switching current to a load circuit, a latch circuit including first and second transistors connected to monitor a voltage caused by current in the load circuit and to shunt current away from the field effect transistor in response to current overload in the load circuit, the first and second transistors having temperature characteristics such that they turn on in response to different voltages at different temperatures, the improvement including a second means for turning on the latch to shunt current away from the field effect transistor in response to the voltage caused by current in the load circuit, the second apparatus including temperature compensating apparatus for matching the temperature characteristics of the first and second transistors of the latch circuit whereby the latch turns on at the same voltage in the load circuit over the typical operating range of the device.

3 Claims, 3 Drawing Sheets

TEMPERATURE COMPENSATED OVERLOAD TRIP LEVEL SOLID STATE RELAY

BACKGROUND OF THE INVENTION

1. Field of the Invention

This invention relates to relay circuits and, more particularly, to methods and apparatus for compensating for temperature changes affecting the overload trip level in such circuits.

2. History of the Prior Art

A great variety of solid state relays circuits have been devised which use a power semiconductor as the output switching device and use a silicon controlled rectifier or similar latching circuit to sense a current overload or short circuit condition. For example, U.S. Pat. No. 4,581,540 discloses such a circuit.

Although the circuit disclosed in the prior art patent application accomplishes its purpose well to limit overload current in normal operating conditions, the circuit does have a relatively high trip voltage of approximately 450 millivolts at room temperature of 25 degrees C., and that trip voltage is sensitive to changes in temperature in the operating environment. For example, when the circuit is used in environments in which the temperature varies from −55 degrees C. to 115 degrees C. (a relatively normal range for aircraft operation, for example), the trigger level at which the current protection trips the cutoff of the switching device varies by approximately 400% from 150 to 600 millivolts.

Although the objectives can be met by using operational amplifiers and comparators circuitry, such arrangements require the use of additional power supplies, eliminate the ability to provide optical isolation of the input, and often incur large increases in input current. These changes increase the cost, complexity, and size of the circuitry while decreasing its reliability.

SUMMARY OF THE INVENTION

It is, therefore, an object of the present invention to provide an improved solid state relay with current overload protection which has a lower trip voltage level for triggering the overload protection.

It is another more specific object of the present invention to reduce the temperature variation of the trip voltage level for triggering current overload protection in a solid state relay circuit.

It is another object of the present invention to provide higher input impedance and lower power dissipation in solid state relay with current overload protection.

These and other objects of the present invention are realized in a solid state relay circuit comprising a metal oxide field effect transistor connected for switching current to a load circuit, a latch circuit including first and second transistors connected to monitor a voltage caused by current in the load circuit and to shunt current away from the field effect transistor in response to current overload in the load circuit, the first and second transistors having temperature characteristics such that they turn on in response to different voltages at different temperatures, the improvement comprising second means for turning on the latch to shunt current away from the field effect transistor in response to the voltage caused by current in the load circuit, the second means comprising temperature compensating means for matching the temperature characteristics of the first and second transitors of the latch circuit whereby the latch turns on at the same voltage in the load circuit over the typical operating range of the device.

These and other objects and features of the invention will be better understood by reference to the detailed description which follows taken together with the drawings in which like elements are referred to by like designations throughout the several views.

DETAILED DESCRIPTION OF THE INVENTION

Figure 1:
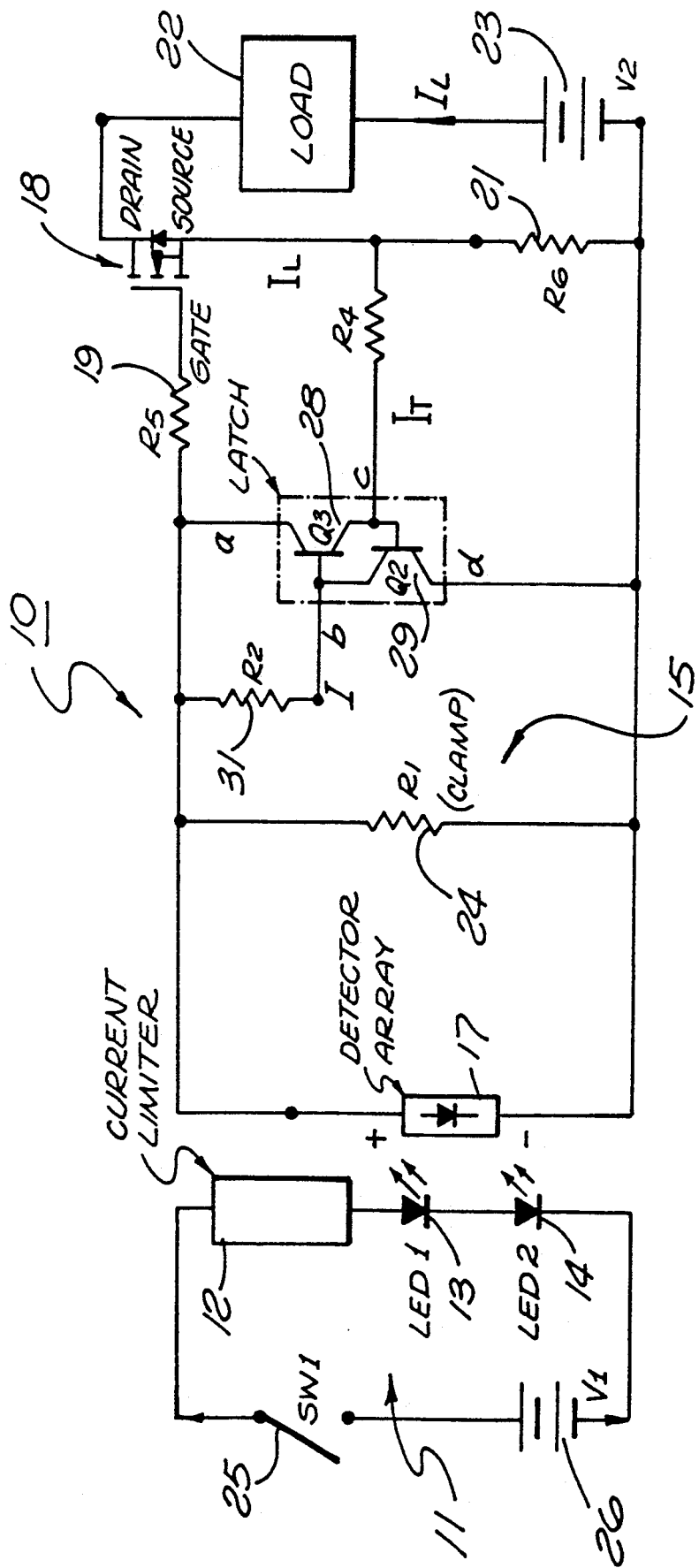
FIG. 1 is a schematic diagram of a solid state relay circuit of the prior art.

FIG. 1 illustrates a solid state relay circuit 10 of the prior art. The circuit 10 includes an input portion 11 including a current limiter 12 and a pair of light emitting diodes 13 and 14. A switching portion 15 includes a detector array 17 which is arranged to sense light generated by the light emitting diodes 13 and 14 and thereby provide the desired circuit isolation of the input circuitry. The detector array 17 is connected to the gate of a switching device 18 (which may preferably be a metal oxide field effect transistor) through a current limiting resistor 19. The detector array 17 is also connected to the source terminal of the switching device 18 through a resistor 21. A load circuit 22 and a voltage source 23 are arranged in series connecting the drain terminal of the switching device 18 and the resistor 21. Another resistor 24 is connected across the detector array 17.

In the normal operation of the switching relay, the provision of an input signal in the input portion of the circuit 10 (exemplified by the closing of a switch 25 to connect a battery 26 into the circuit) causes the light emitting diodes 13 and 14 to provide a light output which is detected by the detector array 17. The detector array 17 provides a signal between the gate and the source terminals of the switching device 18 which, when sufficient, turns on the switching device 18 and provides current to the load 22. When the input signal is removed from the input portion 11, the detector array 17 no longer generates a signal sufficient to operate the switching device 18; and that device 18 turns off, removing current from the load 22.

There are different conditions which may generate an overload current in the load 22 and such an overload current may damage or destroy the switching device 18 or the load 22. To limit the range of currents which may be furnished to the load 22 through the switching device 18, the circuit 10 is provided and arrangement for turning off the switching device in the presence of overload currents. The particular arrangement illustrated in FIG. 1 includes a first PNP transistor 28 and a second NPN transistor 29 connected to form a latch to short current away from the switching device 18. A resistor 31 joins the detector array 17 to the base of the transistor 28 and the collector of the transistor 29. The emitter of the transistor 28 is connected to the upper terminal of the detector array 17, and the emitter of the transistor 29 is connected to the lower terminal of the detector array 17. A resistor 32 is connected between the source terminal of the switching device 18 and the resistor 21 to provide a measure of the voltage across the resistor 21 to the collector of the transistor 28 and the base of the transistor 29 during operation of the switching device 18.

The latch arrangement effectively provides a pair of input terminals, one which measures the voltage across the resistor 21 and a second which measures a current to the collector of the transistor 29. The value of the resistor 21 is selected so that if the current through the load 22 becomes too large, the voltage across the resistor 21 (which is a measure of this current) increases to the point at which the latch is enabled, shorting the input across the source and drain terminals of the switching device 18. The voltage difference between the base and emitter junction of the transistor 29 turns that transistor on and causes current to be drawn through the emitter-base junction on the transistor 28. The transistor 28 turns on and locks the latch in the ON state. This causes the switching device 18 to be disabled, removing current from the load 22.

A major problem of the circuit 10 illustrated in FIG. 1 is that the voltage required to trigger the latch comprising the transistors 28 and 29 into operation changes drastically with temperature. Since this voltage is determined by measuring across the resistor 21, it is, in effect, a measure of the current through the switching device 18 and the load 22; and this value is allowed to vary drastically with temperature. More particularly, in a particular arrangement 10, the value of current through the load required to operate the latch varies from 1.3 amperes at −55 degrees C. through 1 ampere at 25 degrees C. to 0.33 amperes at 115 degrees C. Moreover, since the trip voltage necessarily varies in the same degree, the nominal trip voltage must be kept much higher than would be necessary were the value more stable. Coupled with the lower trip voltage would come lower overall power dissipation for the circuitry.

Figure 2:
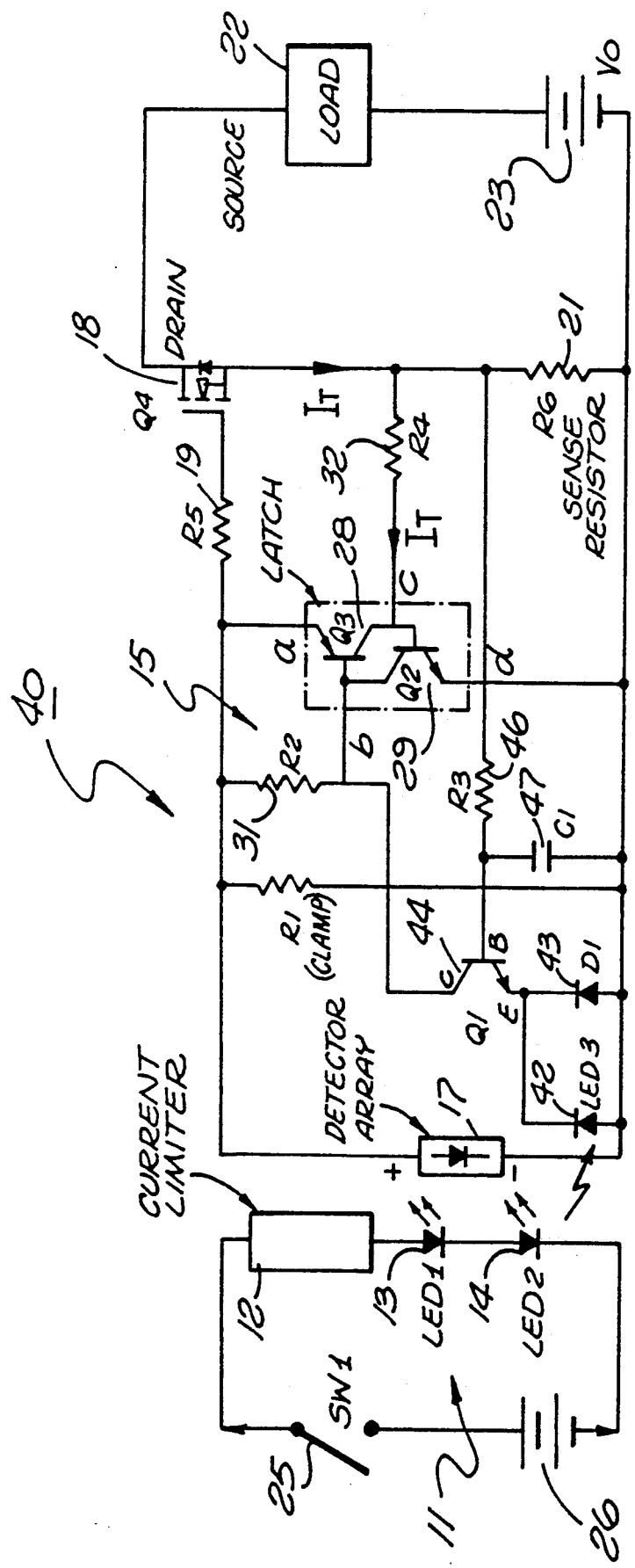
FIG. 2 is a schematic diagram of a switching circuit in accordance with the invention.

FIG. 2 illustrates a switching circuit 40 designed in accordance with the present invention. The circuit 40 includes elements of an input portion 11 essentially identical to the circuit 10 of FIG. 1 for energizing a pair of light emitting diodes 13 and 14 to provide an electrically isolated input. The switching circuit 40 also includes an output portion 15 which includes all of the elements of the output portion 15 of the circuit 10, all of which are identified by identical numbers in the figures. To the output portion of FIG. 2 are added a number of elements which cooperate with those the operation of which has already been explained to provide temperature compensation to the circuit 40.

These elements include a light emitting diode 42 arranged in parallel with a silicon diode 43. The light emitting diode 42 is optically coupled to one or both of the light emitting diodes 13 and 14 to sense the presence of an input signal in the input portion 11. The parallel arrangement of the silicon diode 43 and the light emitting diode 42 is connected to the emitter terminal of an NPN transistor 44 which has its collector connected to the base of the transistor 28 and the collector of the transistor 29. The base of the transistor 44 is connected by a resistor 46 between the switching device 18 and the resistor 21. A capacitor 47 is connected between the base of the transistor 44 and the negative side of the source voltage 23.

When input is applied as by closing the switch 25 in the input portion 11, the light emitting diodes 13 and 14 furnish detectable light to the detector array 17 and to the light emitting diode 42. The light emitting diode 42 is selected to generate about 1.1 volts when an open circuit and provides approximately 20 microamperes current in the short circuit condition. However, the light emitting diode 42 is connected in parallel with the silicon diode 43; consequently, the voltage across the light emitting diode 42 is constrained to be that across the diode 43. The voltage of the diode 43 varies with temperature from approximately 0.5 volts at −55 degrees C. through 0.350 volts at 25 degrees C. to 0.05 volts at 115 degrees C.

Since the transistor 44 is connected to the input at the base of the transistor 28 of the latch, when the transistor 44 turns on it will trigger the operation of the latch to short circuit the switching device 18 and turn off the circuit 40. The transistor 44 is turned on when the voltage applied across the resistor 21 becomes large enough that the voltage applied between the base and the emitter terminals of the transistor 44 becomes sufficiently great. The value of resistor 46 is chosen to provide little voltage drop so that biasing of the base-emitter terminals of the transistor 44 is essentially the difference created by the voltage across the resistor 21 and the voltage across the diode 43. As pointed out above, the voltages required to turn on a transistor (such as the latch transistors 28 and 29) and the voltage across the diode 43 vary with temperature. Consequently, by selecting a transistor 44 having a turn on voltage which varies across the expected temperature range in a manner which matches the variation of voltage across the silicon diode 43, a constant turn on voltage across the resistor 21 may be attained. This, in turn, translates into a relatively constant tripping of the latch comprising the two transistors 28 and 29 because the trip occurs at the current sink terminal of the latch rather than the voltage sensitive input terminal. Ultimately this translates into a relatively constant trip current through the switching device 18.

Using typical numerical values of emitter-base trip voltage of 0.450 volts for the transistor 44, a value of 0.350 volts across the diode 43 gives a voltage across the resistor 21 of 0.10 volts to trip the transistor 44 at 25 degrees C. At −55 degrees C., the transistor 44 requires 0.6 volts, the diode 43 drops 0.50 volts so the voltage across the resistor 21 is again 0.10 volts. At 115 degrees C., the voltage across the transistor 44 is 0.15, across diode 43 is 0.05, and across resistor 21 is 0.10.

Thus, it may be seen that the trip current through the switching device 18 is held constant with a wide variation in temperature by the circuit 40. Moreover, the relatively constant value of trip current allows a much lower value to be used to trigger the operation of the latch and, consequently, allows overall lower power dissipation. It should be noted that the combination of the resistor 46 and the capacitor 47 are selected to provide a timing circuit either a slight delay which eliminates nuisance tripping of the transistor 44 by fast current transients.

Figure 3:
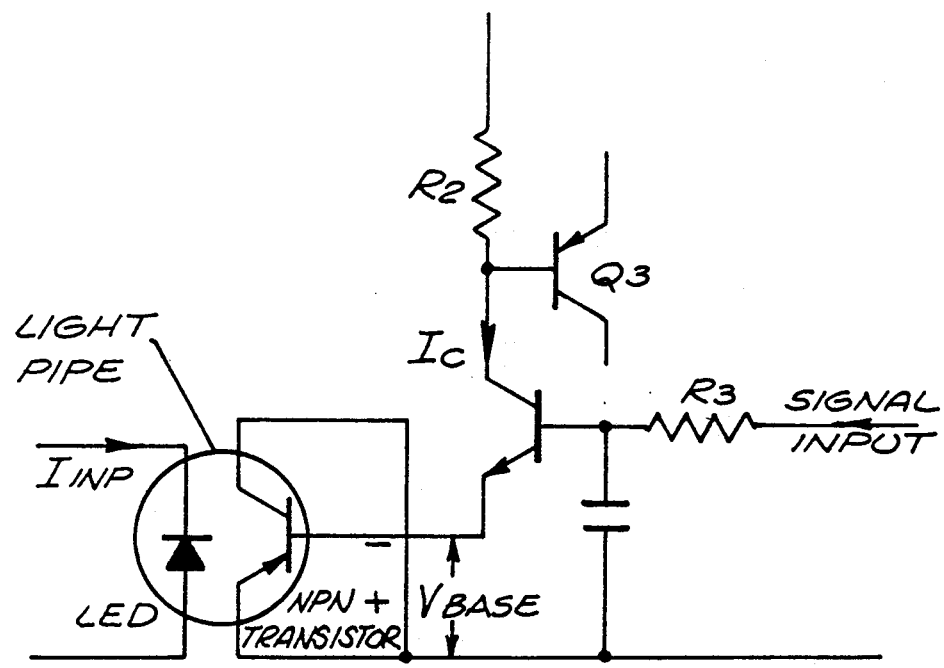
FIG. 3 is a modification to the circuit of FIG. 2.
Figure 4:
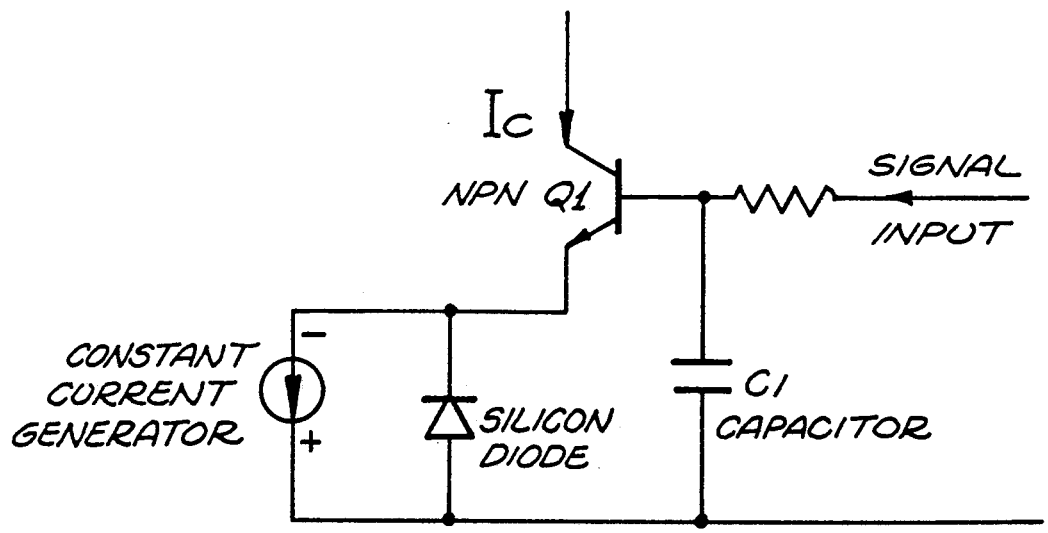
FIG. 4 is a modification to the circuit of FIG. 2.

It will be recognized by those skilled in the art that other methods of implementing the invention are possible. For example, the parallel arrangement of the silicon diode 43 and light emitting diode 42 might be replaced by an NPN transistor with the same voltage-current characteristic of the silicon diode 43 and light emitting diode 42. A light sensitive transistor would provide the desired variation with temperature to compensate for the variation of the trip voltage of the latch with temperature. FIG. 3 illustrates such a circuit. An additional possibility would be to replace the light emitting diode 42 with a constant current diode or similar constant current device arranged in parallel with the silicon diode 43. FIG. 4 illustrates such a circuit.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In a solid state relay circuit comprising a metal oxide field effect transistor connected for switching current to a load circuit, a latch circuit including first and second transistors connected to monitor a voltage caused by current in the load circuit and to shunt current away from the field effect transistor in response to current overload in the load circuit, the first and second transistors having temperature characteristics such that they turn on in response to different voltages at different temperatures, the improvement comprising second means for turning on the latch to shunt current away from the field effect transistor in response to the voltage caused by current in the load circuit, the second means comprising temperature compensating means for matching the temperature characteristics of the first and second transistors of the latch circuit whereby the latch turns on at the same voltage in the load circuit over the typical operating range of the device.

2. In a solid state relay circuit as claimed in claim 1, the temperature compensating means comprising a third transistor connected to provide a current path in the operating condition for turning on one of the transistors of the latch circuit, the transistor having its base-emitter terminals connected to sense the voltage in the load circuit.

3. In a solid state relay circuit as claimed in claim 2, the temperature compensating means comprising means for lowering the turn-on voltage of the third transistor.

* * * * *